United States Patent
Glasser

(10) Patent No.: US 6,734,431 B1
(45) Date of Patent: May 11, 2004

(54) HIGH DYNAMIC RADIATION DETECTION DEVICE

(75) Inventor: Francis Glasser, Eybenes (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/959,465

(22) PCT Filed: May 18, 2000

(86) PCT No.: PCT/FR00/01348

§ 371 (c)(1), (2), (4) Date: Oct. 26, 2001

(87) PCT Pub. No.: WO00/72386

PCT Pub. Date: Nov. 30, 2000

(30) Foreign Application Priority Data

May 19, 1999 (FR) .............................................. 99 06335

(51) Int. Cl.$^7$ .............................................. G01N 23/04
(52) U.S. Cl. .............................. 250/370.01; 250/370.08; 250/591; 250/580
(58) Field of Search ....................... 250/370.01, 370.08, 250/370.09, 370.1, 370.13, 591, 580, 584

(56) References Cited

U.S. PATENT DOCUMENTS

| | | | | |
|---|---|---|---|---|
| 4,826,777 A | * | 5/1989 | Ondris | 438/80 |
| 5,635,410 A | * | 6/1997 | Kusuda | 438/798 |
| 6,043,495 A | * | 3/2000 | Verger et al. | 250/370.01 |
| 6,169,287 B1 | * | 1/2001 | Warburton | 250/370.1 |
| 6,229,877 B1 | * | 5/2001 | Agano | 378/154 |
| 6,501,089 B1 | * | 12/2002 | Kuwabara | 250/591 |

FOREIGN PATENT DOCUMENTS

| | | |
|---|---|---|
| EP | 0252820 | 1/1988 |
| EP | 09043357 | 2/1997 |
| JP | 62162986 | 7/1987 |

* cited by examiner

*Primary Examiner*—Constantine Hannaher
*Assistant Examiner*—Otilia Gabor
(74) *Attorney, Agent, or Firm*—Thelen Reid & Priest, LLP

(57) ABSTRACT

A device for detecting energy radiation includes a semiconducting material capable of converting the radiation into electric charges, a measurement electrode, and a measurement circuit to measure the current delivered by the electrode. The device further includes polarisation electrodes constituted of conductive zones insulated electrically from each other, the polarisation electrodes and a measurement electrode sandwiching the material, and a voltage supply adapted to bring each of these conductive zones to an adjustable voltage.

12 Claims, 2 Drawing Sheets

HIGH DYNAMIC RADIATION DETECTION DEVICE

"This application is a national phase of PCT/FR00/01348 which was filed on May 18, 2000, and was not published in English."

TECHNICAL FIELD

The invention relates to a radiation detection device with high dynamic range. By high dynamic range detection device one means a device capable of detecting both low flux and high flux radiation.

The radiation in question can be X or γ radiation, but one can also use other types of radiation, of corpuscular type for example, such as proton beams. The only restriction is that this radiation must be able to create electric charges within a semiconducting material in a volume of the order of a cubic millimetre.

The invention can be applied in particular in the medical domain. For example, for radiography, the X-rays used, before arriving on the detector device, cross the body of a patient or are absorbed in non-homogeneous fashion. The exiting flux can thus vary considerably locally (several decades).

Another example can be taken from radiotherapy: the patient can be irradiated at very low level to begin with for positioning, and then very highly irradiated afterwards for treatment.

A further domain is that of non-destructive monitoring by radiography, for example inside containers (loading ships) which can have very varied absorption levels.

STATE OF PRIOR ART

At present, and in particular in the medical domain, radiation detectors (for example X or γ) are usually scintillation detectors operating on a principal of indirect detection: the incident photon reacts with the scintillation substance, creating photons of another type, photons which are multiplied by a photo-multiplier in order to provide a measurable electric signal.

These detectors have an efficiency and a resolution which can be insufficient for certain applications.

These characteristics can be improved by replacing the scintillation detectors by semiconductor detectors. FIG. 1 is a diagram of a detector of this type.

As shown, the detector comprises a semiconducting material 2 sandwiched by two electrodes 4 and 6, supply means 8 capable of bringing the electrode 6 to an appropriate voltage (−V), means for measuring the current (i) delivered, comprising, in the example shown, an amplifier 10 whose output is returned to the input by a condenser 12, a circuit-breaker 14 also being attached to the terminals of this condenser. The device also comprises an apparatus for measuring the current (or the voltage 16). The radiation one wishes to detect is referenced 20 and crosses the semiconducting material 2.

The operation of this device is as follows. The radiation 20 interacts with the semiconducting material 2, creating electric charges. For the same incident radiation, the number of charges created is of an order of size greater than that obtained by indirect detection by a scintillation detector. The electric field created in the material by the electrodes makes it possible to collect these charges on the electrodes and in particular on electrode 4. These charges are then stored in the condenser 12 and processed in the circuit 16 which delivers a signal representative of the radiation.

The integration condenser 12 has dimensions enabling it to store the maximum quantity of charges that the semiconducting material can deliver. This quantity is a function of the value of the incident flux. If the flux is very high, the number of charges to store will be high and the capacities needed for storing them will he high. These capacity values may either not be available on the market for electronic components, or may involve integrated capacity surfaces that are too big for the space available on the circuit.

Thus the solution lies in reducing the quantity of charges to be stored, only when the incident flux is too high. But it is essential to preserve the fundamental qualities of the detector, that is to say good spatial resolution or good contrast. The spatial resolution is the minimum distance separating the points of interaction of two incident photons with the material in order that the detector can differentiate between them.

The quantity of charges to be stored cannot be diminished by simple reduction of the number of photons arriving at the detector. This method, valid for high fluxes, is not suitable for low fluxes and the detector would lose the dynamic range needed for the application. Furthermore, the number of incident photons must remain consistent since the noise of the electric signal is proportional to $1\sqrt{N}$ where N is the number of photons absorbed by the whole volume of the detector.

The present invention has the particular aim of proposing a radiation detection device with high dynamic range, which does not have these drawbacks and makes it possible to satisfy these contradictory requirements.

DESCRIPTION OF THE INVENTION

In order to do this, the invention proposes a device whose essential characteristic is that the polarisation electrode, unlike the measurement electrode, is fragmented into conductive zones insulated from each other electrically, the supply means being capable of bringing each of these zones to an appropriate voltage.

During operation, the incident radiation is injected in a direction, perpendicular to the fractionation direction of the polarisation electrode.

These means make it possible to operate the device in two different ways, according to the applications envisaged:
- either when working at low voltage, on the totality of the material, in which case low noise is obtained and the contrast is improved,
- or when working on only a part of the material but at high voltage, in which case the spatial resolution is improved.

To be precise, the aim of invention is thus a device for detection of energy radiation, comprising a semiconducting material able to convert this radiation into electric charges, a measurement electrode and a measurement circuit for measuring the current delivered by this electrode, characterised in that it further comprises polarisation electrodes constituted of conductive zones insulated from each other electrically, said polarisation electrodes and the measurement electrode sandwiching the material and the supply means capable of bringing each of these conductive zones to an adjustable appropriate voltage.

Preferably, the semiconducting material takes the form of a parallelepiped bar with a depth intended to be oriented parallel to the direction of the radiation, a width and a height, this bar having two parallel faces separated by said height, the measurement electrode and the polarisation electrodes being set on these faces.

Preferably, in this variant, the conductive zones of the polarisation electrode are in the form of rectangular strips with a length parallel to the width of the bar and a width parallel to the depth of the bar.

In another variant, the measurement electrode is constituted of rectangular conductive strips with a length parallel to the depth of the bar and a width parallel to the width of the bar.

The fragmentation zones can take various forms, rectangular strips in particular.

DESCRIPTION OF PARTICULAR EMBODIMENTS

Figure 1:
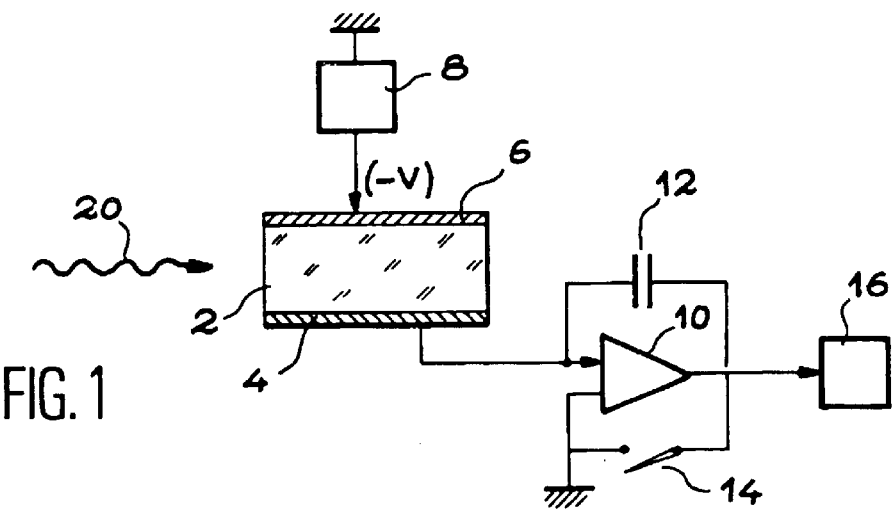
FIG. 1, described above, shows a prior art detector.
Figure 2:
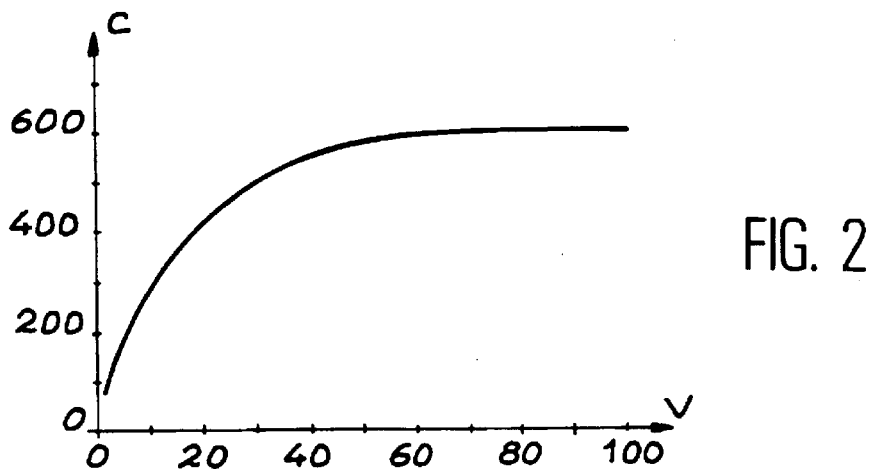
FIG. 2 shows the evolution of the number of charges collected in function of the polarisation value of the electrodes.

According to a first embodiment of the device according to the invention, the number of charges collected is reduced by reducing the electric field applied to the semiconducting material, thus the voltage applied to the electrodes. This embodiment has never been used in prior art, because it was considered that by lowering the operational voltage, the charge carriers would migrate more slowly and would partly be caught. Depending on the location of the radiation-material interaction (near the electrodes or at the centre of the bar), the quantity of charges stored in the condenser will vary considerably and the measured signal will be difficult to reproduce. However, the Applicant has demonstrated that this does not concern high energy photons (of the order of MeV). In fact, such photons create electron-hole pairs in a large volume, with typical cross section of the order of 1 to several mm$^2$. Thus charges exist throughout the whole volume separating the electrodes. When the number of incident photons is high (which is the case when the problem of excess charges arises), it can be considered that the division of charges in the volume of the semiconductor is uniform (on average). Therefore, although the output signal reduces with the polarisation voltage, it nonetheless remains stable and reproducible. This is confirmed in FIG. 2, which shows the measured charge C (arbitrary unit) as a function of the polarisation voltage V, expressed in volts. The curve (exponential) is smooth and demonstrates a direct relationship between the variation in voltage and the variation in the quantity of charges collected.

This first embodiment thus makes it possible to reduce the quantity of charges to be processed while still preserving the contrast. But this is detrimental to the spatial resolution. In order to counteract this inconvenience, the invention proposes another embodiment (which moreover can be associated with the first) and which uses the fragmentation of the polarisation electrode opposed to the measurement electrode.

Figure 3:
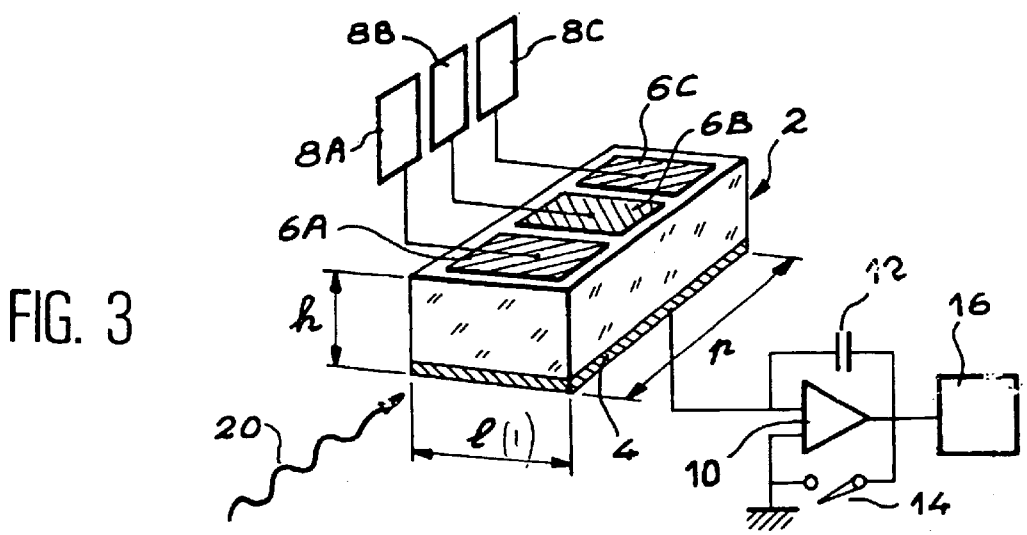
FIG. 3 is a diagram of the fragmentation of an electrode.
Figure 4:
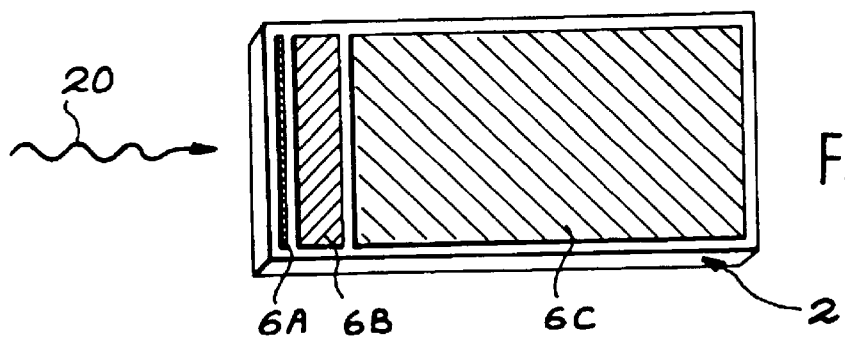
FIG. 4 shows an embodiment of the invention with zones of increasing width.
Figure 5:
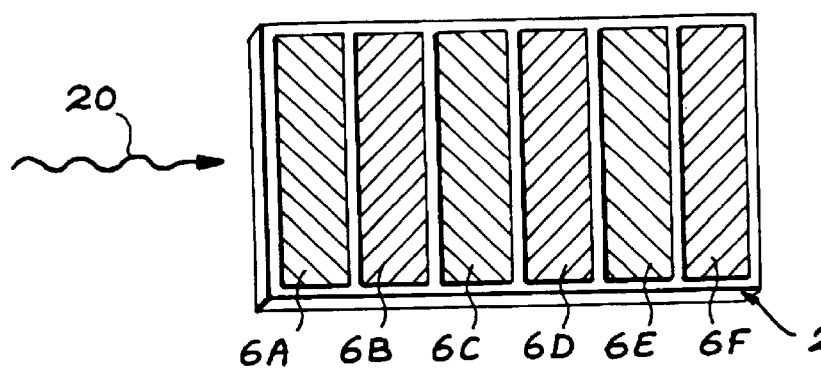
FIG. 5 shows another embodiment of the invention with a succession of strips of the same width.

FIGS. 3, 4 and 5 show examples of embodiments of this fragmentation. These examples refer to a parallelepiped bar but, evidently, this shape is not the only one possible. In FIG. 3, the bar 2 can be seen on a large scale, labelled letter p, parallel to the direction 20 of the radiation to be detected; the bar has a width l and a height h. The faces separated by the height h carry the electrodes. In the case illustrated, there are three polarisation electrodes 6A, 6B and 6C, insulated electrically from each other and linked to three supply means 8A, 8B, 8C, which are able to supply three adjustable voltages to these three electrodes 6A, 6B, 6C, independent from each other. As for the measurement electrode 4 it is linked to a single circuit for measuring current, that is in the example shown, a circuit comprising an amplifier 10, a condenser 12, a circuit breaker 14 and a circuit for measuring the current 16.

Thus one obtains a device whose interaction volume is adjustable according to whether or not one applies voltages to the different polarisation electrodes.

Depending on the value of the incident flux, one or several zones can be connected and thus activated for collecting charges; other zones can have zero polarisation. When the incident flux is low, all the polarisation electrodes can be connected in order to collect the maximum of charges; when the flux rises, one or several electrodes can be deactivated, earthed for example.

In this operational mode, only the charges created regarding the supplied polarisation electrodes are collected (by the single measurement circuit). Since the number of charges to be collected is lower, the voltage can be adjusted to its optimum value, that is to a value sufficiently high to obtain good quality spatial resolution.

Besides, since the volume of material involved is smaller, the number of photons participating in the creation of charges is smaller, which results in a rise in the noise level, thus lowering the contrast. This operational mode thus makes it possible reduce the quantity of charges without losing spatial resolution but to the detriment of the contrast.

In certain cases, it may be suitable to use the two operational modes described at the same time, by reducing the surface of the active electrodes and applying a voltage to them which is lower than the optimum voltage.

FIG. 4 illustrates a variant of the device intended to respond to flux with a very high dynamic range. In this variant, which again comprises three polarisation electrodes 6A, 6B and 6C, under the form of strips, the width of the conductive strips (counted parallel to the depth of the bar) changes from one strip to the other following a common ratio of 10 (the width is 10 times greater for zone 6B than for zone 6A and 10 times greater for zone 6C than for zone 6B). Thus one can obtain two decades. The length of the strips 6A, 6B, 6C counted parallel to the width l of the bar is closely equal to the width of the bar.

The first zone 6A, very narrow, is to be used with an optimum voltage and will make it possible to obtain information with high spatial resolution, whereas the second zone 6B and possibly the third 6C will be used with a low voltage and will make it possible to obtain information with high contrast.

This variant is interesting in the case of beams, which diffuse into the material in a pear-shaped volume, the depth of the narrow part of the pear fixing the width of the first zone 6A.

This variant can also be used in the case of an incident multi-energy beam, for example with energy varying from 50 keV to 20 MeV. The first electrode will be dimensioned to stop 99% of the photons of 50 keV (low energy), the second to stop 95% of the photons of several hundreds of keV and the third to stop the an remaining high energy photons (over 500 keV). Typically, the electrodes will have respective widths of 50 to 100 μm, from 200 to 500 μm and from 2 to 3 cm.

This system makes it possible to use a single detector and a single electronic measurement circuit to produce three images at different energies. After processing the images, it is possible to deduce the nature of the substances that have attenuated the beam.

FIG. 5 illustrates another case where six electrodes 6A, 6B, 6C, 6D, 6E, 6F are constituted of strips of the same width. Thus one obtains a periodic structure. The width of the strips can, for example, be 10 mm.

The device according to the invention is particularly advantageous when it is repeated a certain number of times to constitute a matrix. The device is then capable of determining the place of interaction of a photon with the semiconducting material: it then makes it possible to produce an image. Since the fragmentation of the electrodes does not increase the dimensions of the device significantly, it can therefore be set next to other devices of the same type.

Figure 6:
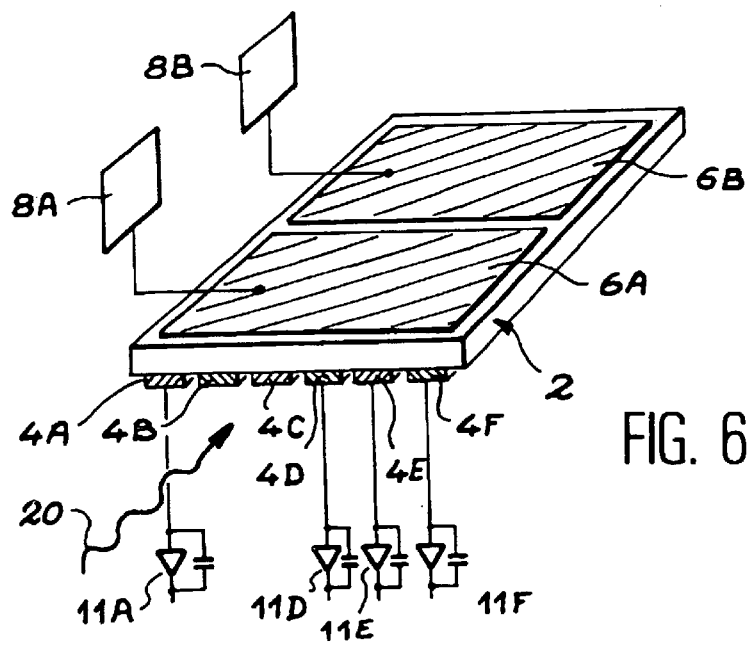
FIG. 6 shows an embodiment of the invention in which the two polarisation electrodes and the measurement electrode are fragmented in two orthogonal directions.

Advantageously, to avoid cutting out and manipulating thin devices, stamping can be carried out on a single bar but of greater width, with a lower fragmentation of the electrode in the depth direction. This is shown in FIG. 6. In this figure, a device can be seen which comprises two polarisation electrodes 6A and 6B and six measurement electrodes 4a, 4b, 4c, 4d, 4e, 4f, constituting rectangular strips parallel to the depth of the bar.

The semiconducting material suitable for use in the invention described above can be one of several and, advantageously, can be chosen among the semiconductors with high resistivity (typically higher than $10^7$ Ωcm) so as to provide a low current when it is polarised and non lit, and among the semiconductors with a factor $\mu\tau$ (product of the mobility by the lifetime of the carriers) sufficiently high so that the charges created and submitted to an electric field have the time to reach the electrodes (typically for an electric field of 0.1 V/cm, $\mu=100$ cm$^2$s$^{-1}$v$^{-1}$, $\tau=1$ μsec).

In particular, the material can be chosen from among the group consisting of CdTe, CdZnTe, AsGa, PbI$_2$, HgI$_2$ and Se.

In the case of detection of X-rays of several MeV for radiography, the device according to the invention is advantageously used under the form of a parallelepiped of CdTe with an input surface of the order of 1 mm$^2$, the depth of the bar being 60 mm, to provide a stopping power sufficient for photons of this energy.

What is claimed is:

1. Device for detecting energy radiation, comprising a semiconducting material capable of converting the radiation into electric charges, a measurement electrode and a measurement circuit to measure the current delivered by the electrode, said device further comprising:

polarisation electrodes constituted of conductive zones insulated electrically from each other, said polarisation electrodes and a measurement electrode sandwiching the material; and a voltage supply adapted to bring each of these conductive zones to an adjustable voltage.

2. Device according to claim 1, wherein the semiconducting material is present in the form of a bar with a depth, a width and a height, this bar having two parallel faces separated by said height, the measurement electrode and the polarisation electrodes being set on these faces.

3. Device according to claim 2, wherein said bar has a parallelepipedic form.

4. Device according to claim 1, wherein the semiconducting material is chosen from among the group consisting of CdTe, CdZnTe, AsGa, PbI$_2$, HgI$_2$ and Se.

5. Device according to claim 1, wherein said voltage supply is further adapted to bring each of said conductive zones to an adjustable voltage independently from each other.

6. Device for detecting energy radiation, comprising:

a semiconducting material capable of converting the radiation into electric charges, said semiconducting material being present in the form of a bar with a depth, a width, and a height, this bar having two parallel faces separated by said height;

a measurement electrode and a measurement circuit to measure the current delivered by the electrode;

polarisation electrodes constituted of conductive zones insulated electrically from each other, said polarisation electrodes and a measurement electrode sandwiching the material, being set on said parallel faces, conductive zones of said polarisation electrodes being in the form of rectangular stripes having a length parallel to the width of said bar and a width parallel to the depth of said bar; and a voltage supply adapted to bring each of these conductive zones to an adjustable voltage.

7. Device according to claim 6, wherein all the strips have the same width.

8. Device according to claim 6, wherein the strips have an increasing width in the direction of the depth of the bar.

9. Device according to claim 8, wherein the strips have widths with a common ratio of 10.

10. Device according to claim 6, wherein the measurement electrode is constituted of rectangular conductive strips having a length parallel to the depth of the bar and a width parallel to the width of the bar.

11. Device according to claim 6, wherein the semiconducting material is chosen from among the group consisting of CdTe, CdZnTe, AsGa, PbI$_2$, HgI$_2$ and Se.

12. Device according to claim 6, wherein said voltage supply is further adapted to bring each of said conductive zones to an adjustable voltage independently from each other.

* * * * *